United States Patent
Wu et al.

(10) Patent No.: US 8,687,368 B2
(45) Date of Patent: Apr. 1, 2014

(54) HEAT-DISSIPATING MODULE AND ASSEMBLED STRUCTURE OF HEAT-DISSIPATING MODULE AND INTEGRATED CIRCUIT CHIPSET

(75) Inventors: Chen-Chang Wu, Taoyuan Hsien (TW); Ching-Hsing Liao, Taoyuan Hsien (TW)

(73) Assignee: Enzotechnology Corp., Chino, CA (US)

( * ) Notice: Subject to any disclaimer, the term of this patent is extended or adjusted under 35 U.S.C. 154(b) by 316 days.

(21) Appl. No.: 13/196,898

(22) Filed: Aug. 3, 2011

(65) Prior Publication Data
US 2012/0327605 A1    Dec. 27, 2012

(30) Foreign Application Priority Data

Jun. 21, 2011    (TW) .............................. 100121631 A

(51) Int. Cl.
*H05K 7/20* (2006.01)
(52) U.S. Cl.
USPC ........... 361/710; 361/703; 361/709; 165/80.3
(58) Field of Classification Search
USPC ............ 361/679.46–679.54, 679.57–679.58, 361/688–690, 696–697, 701–710, 715–722
See application file for complete search history.

(56) References Cited

U.S. PATENT DOCUMENTS

| | | | | |
|---|---|---|---|---|
| 5,804,875 A | * | 9/1998 | Remsburg et al. ............ | 257/718 |
| 6,788,538 B1 | * | 9/2004 | Gibbs et al. ................... | 361/704 |
| 7,013,555 B2 | * | 3/2006 | McCullough ................... | 29/611 |
| 7,056,566 B2 | * | 6/2006 | Freuler et al. ................ | 428/40.1 |
| 7,944,698 B2 | * | 5/2011 | Colbert et al. ................ | 361/709 |
| 8,063,485 B1 | * | 11/2011 | Azar ............................ | 257/727 |
| 8,274,793 B2 | * | 9/2012 | Wang et al. ................... | 361/709 |
| 2004/0052064 A1 | * | 3/2004 | Oliver et al. .................. | 361/816 |
| 2004/0052998 A1 | * | 3/2004 | Freuler et al. ................ | 428/40.1 |
| 2010/0321894 A1 | * | 12/2010 | Wang et al. ................... | 361/709 |
| 2013/0148306 A1 | * | 6/2013 | Lostoski ....................... | 361/720 |

* cited by examiner

Primary Examiner — Courtney Smith

(57) ABSTRACT

An assembled structure includes an integrated circuit chipset and a heat-dissipating module. The heat-dissipating module includes a heat sink, a locking member and at least one elastic element. The heat sink includes a base and a plurality of fins. The locking member includes a rectangular frame with at least one sustaining part. Two first lateral plates are downwardly extended from a first side and a second side of the rectangular frame, respectively. The first side and the second side are opposed to each other. In addition, at least one hook is formed on an inner surface and a lower edge of each first lateral plate. The elastic element has a first part sustained against the base of the heat sink and a second part sustained against the sustaining part of the rectangular frame. The hooks are engaged with a bottom surface of the substrate of the integrated circuit chipset.

17 Claims, 9 Drawing Sheets

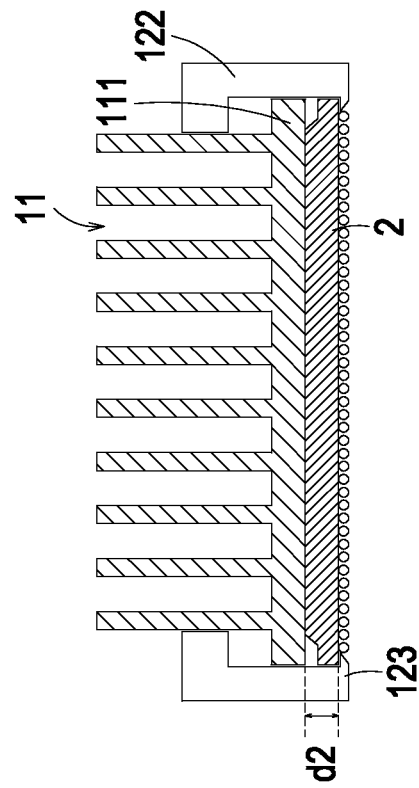
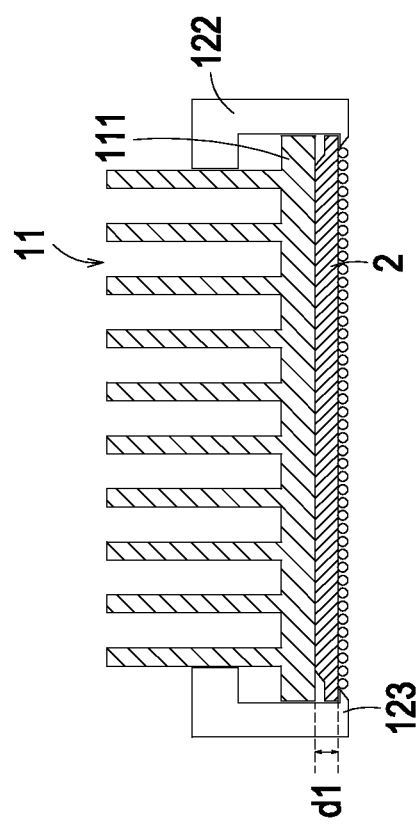

HEAT-DISSIPATING MODULE AND ASSEMBLED STRUCTURE OF HEAT-DISSIPATING MODULE AND INTEGRATED CIRCUIT CHIPSET

FIELD OF THE INVENTION

The present invention relates to a heat-dissipating module, and more particularly to a heat-dissipating module applied to various integrated circuit chipsets with different thicknesses and an assembled structure of the heat-dissipating module and an integrated circuit chipset.

BACKGROUND OF THE INVENTION

Nowadays, the computing speed and the consumption power of the integrated circuit chipset installed within an electronic device are significantly increased. Consequently, during operations, the integrated circuit chipset may generate much heat. For avoiding the performance degradation and the burnt-out of the integrated circuit chipset, it is necessary to dissipate the heat immediately and effectively. Generally, a heat sink is used to dissipate the heat generated by the integrated circuit chipset. The heat sink is attached on a surface of the integrated circuit chipset. In addition, a locking device is used for securely fixing the heat sink on the integrated circuit chipset, so that the heat generated by the integrated circuit chipset can be transferred to the heat sink and then radiated to the surroundings.

For securely fixing the heat sink on the integrated circuit chipset, an adhesive thermal pad may be arranged between the heat sink and the integrated circuit chipset. Moreover, in response to a downward force exerted on the heat sink, a close contact between the heat sink and the integrated circuit chipset is achieved. Under this intended circumstance, the heat-dissipating efficacy of the heat sink is enhanced.

However, the use of the heat sink to remove the heat from the integrated circuit chipset in the conventional ways still has some drawbacks. For example, since the thickness of the integrated circuit chipset (or the total thickness of the integrated circuit chipset and the thermal pad) is varied according to the practical requirements, various locking devices are produced to comply with different thicknesses of different integrated circuit chipsets. The locking device has specified resilient arms and resilient points. That is, every kind of locking device is applied to an integrated circuit chipset with a corresponding thickness. Under this circumstance, the preparation cost and the stock cost are increased, and the stock management becomes complicated. Moreover, the contact pressure between the heat sink and the integrated circuit chipset fails to be adaptively adjusted according to the thickness of the integrated circuit chipset. If the contact pressure is insufficient or the tolerance is poor, the heat-dissipating efficacy is deteriorated. Whereas, if the contact pressure is too large, the integrated circuit chipset is possibly damaged.

Moreover, the layout space of the resilient arms and resilient points may decrease the heat-dissipating area of the heat sink, and thus the heat-dissipating efficacy is reduced. That is, the heat-dissipating area of the heat sink fails to be effectively utilized. In a case that the integrated circuit chipset is a ball grid array (BGA) chipset, the solder balls (i.e. the pins) of the chipset are very close to the periphery of the substrate. If the locking device for locking the periphery of the substrate is made of metallic material, the locking device is possibly contacted with the solder balls to result in a short-circuited problem. On the other hand, if the locking device is made of plastic material, the short-circuited problem is avoided but the heat sink and the integrated circuit chipset fail to be securely combined together.

SUMMARY OF THE INVENTION

The present invention provides a heat-dissipating module applied to various integrated circuit chipsets with different thicknesses. The heat-dissipating module is simple and easily assembled/disassembled, and the preparation cost and stock cost are both reduced.

The present invention also provides a heat-dissipating module capable of adaptively adjusting the contact pressure between the heat-dissipating module and an integrated circuit chipset according to the thickness of the integrated circuit chipset. Consequently, the problems resulting from insufficient or too large contact pressure will be avoided.

The present invention further provides a heat-dissipating module applied to various integrated circuit chipsets with different thicknesses in order to avoid the short-circuited problem.

The present invention further provides an assembled structure of a heat-dissipating module and an integrated circuit chipset in order to achieve the above benefits and solve the above problems.

In accordance with an aspect of the present invention, there is provided a heat-dissipating module. The heat-dissipating module includes a heat sink, a locking member and at least one elastic element. The heat sink includes a base and a plurality of fins. The locking member includes a rectangular frame with at least one sustaining part. Two first lateral plates are downwardly extended from a first side and a second side of the rectangular frame, respectively. The first side and the second side are opposed to each other. In addition, at least one hook is formed on an inner surface and a lower edge of each first lateral plate. The elastic element has a first part sustained against the base of the heat sink and a second part sustained against the sustaining part of the rectangular frame.

In accordance with another aspect of the present invention, there is provided an assembled structure. The assembled structure includes an integrated circuit chipset and a heat-dissipating module. The integrated circuit chipset includes a substrate and a chip. The heat-dissipating module is combined with the integrated circuit chipset. The heat-dissipating module includes a heat sink, a locking member and at least one elastic element. The heat sink includes a base and a plurality of fins. The locking member includes a rectangular frame with at least one sustaining part. Two first lateral plates are downwardly extended from a first side and a second side of the rectangular frame, respectively. The first side and the second side are opposed to each other. In addition, at least one hook is formed on an inner surface and a lower edge of each first lateral plate. The elastic element has a first part sustained against the base of the heat sink and a second part sustained against the sustaining part of the rectangular frame. Moreover, the hooks of the first lateral plates of the locking member are engaged with two opposite edges of a bottom surface of the substrate of the integrated circuit chipset.

The above contents of the present invention will become more readily apparent to those ordinarily skilled in the art after reviewing the following detailed description and accompanying drawings, in which:

BRIEF DESCRIPTION OF THE DRAWINGS

FIGS. 6A, 6B, 6C and 6D schematically illustrate four exemplary assembled structures, in which the thicknesses of the integrated circuit chipsets of the assembled structures are varied.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
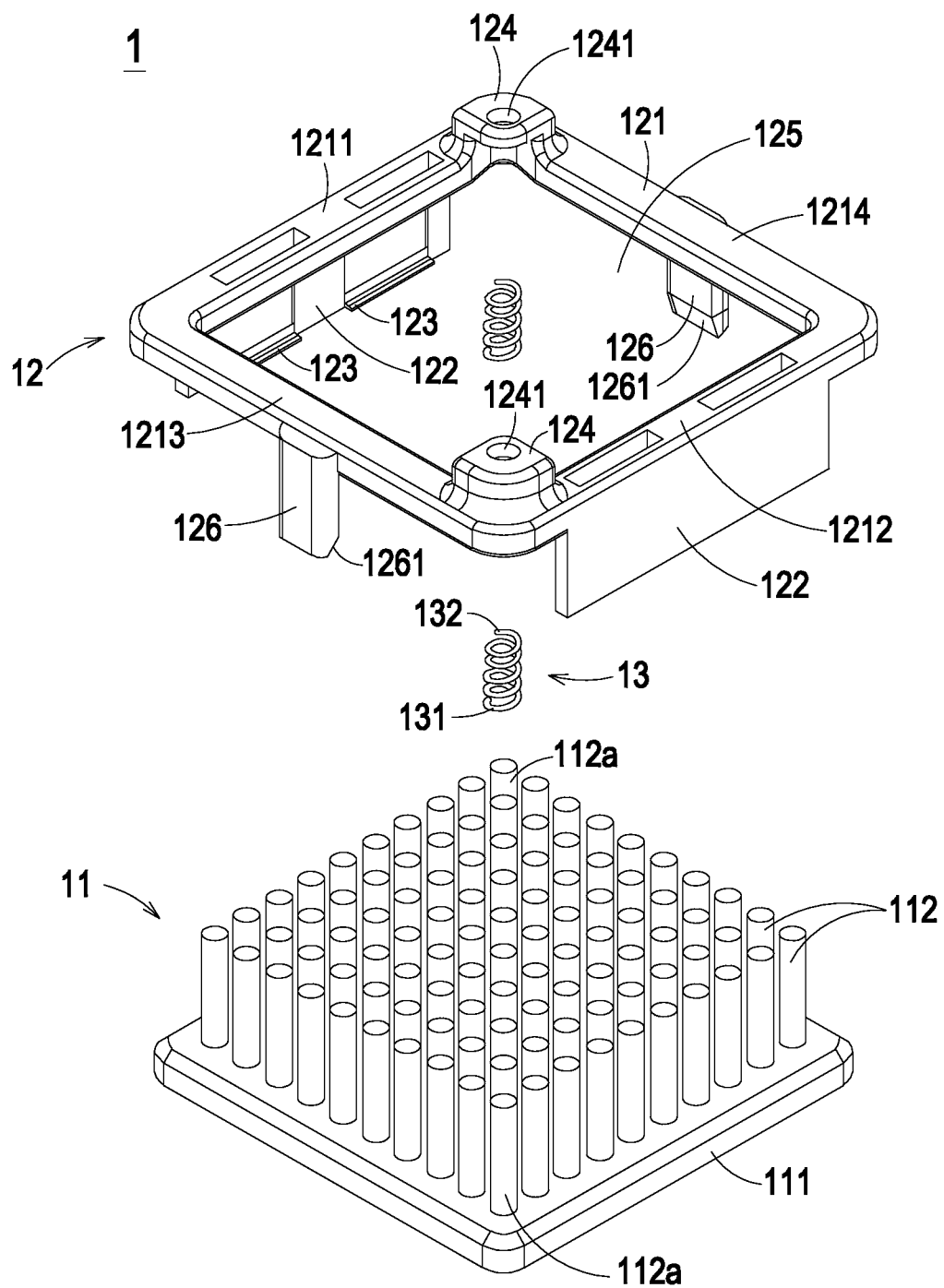
FIG. 1 is a schematic exploded view illustrating a heat-dissipating module according to an embodiment of the present invention.
Figure 2:
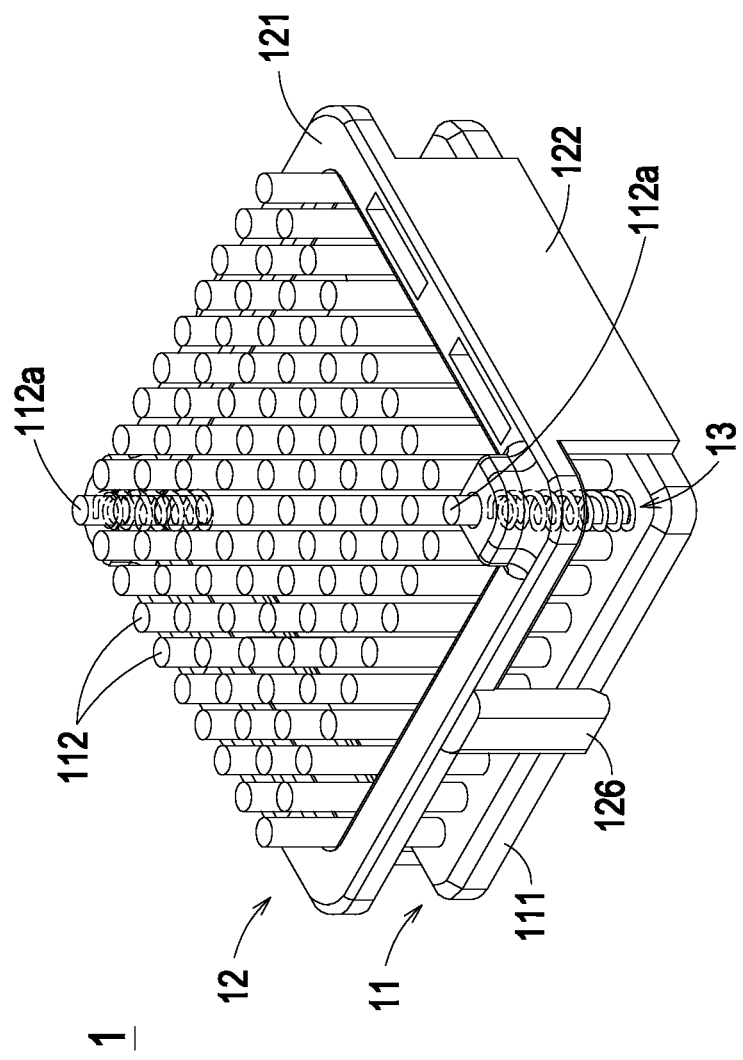
FIG. 2 is a schematic assembled view illustrating the heat-dissipating module of FIG. 1.

FIG. 1 is a schematic exploded view illustrating a heat-dissipating module according to an embodiment of the present invention. FIG. 2 is a schematic assembled view illustrating the heat-dissipating module of FIG. 1. Please refer to FIGS. 1 and 2. The heat-dissipating module 1 is applied to an integrated circuit chip, wherein the thickness d of the integrated circuit chipset may be varied according to the practical requirements. The heat-dissipating module 1 comprises a heat sink 11, a locking member 12 and one or more elastic elements 13. The heat sink 11 comprises a base 111 and a plurality of fins 112. The locking member 12 comprises a rectangular frame 121. For example, the locking member 12 is made of plastic material. Two first lateral plates 122 are downwardly extended from a first side 1211 and a second side 1212 of the rectangular frame 121, respectively. The first side 1211 and the second side 1212 are opposed to each other. In addition, at least one hook 123 is formed on the inner surface and the lower edge of each first lateral plate 122. The rectangular frame 121 further comprises a sustaining part 124. A first part 131 (e.g. a first end) of the elastic element 13 is sustained against the base 111 of the heat sink 11. A second part 132 (e.g. a second end) of the elastic element 13 is sustained against a bottom surface of the sustaining part 124 of the rectangular frame 121.

The fins 112 of the heat sink 11 are connected with the base 111. Preferably, the base 111 and the fins 112 of the heat sink 11 are integrally formed. In this embodiment, these fins 112 are arranged in an array. The heat sink 11 is made of thermally-conductive metallic material or thermally-conductive plastic material. An example of the thermally-conductive metallic material includes but is not limited to aluminum, copper, or aluminum/copper alloy.

Please refer to FIGS. 1 and 2 again. The rectangular frame 121 of the locking member 12 further comprises a hollow portion 125. After the locking member 12 is combined with the heat sink 11, most of the pins 112 of the heat sink 11 are penetrated through the hollow portion 125. The sustaining part 124 of the rectangular frame 121 is aligned with a corresponding fin 112a. The elastic element 13 is engaged with the specified fin 112a. In a preferred embodiment, the elastic element 13 is sheathed around the specified fin 112a, which is aligned with the sustaining part 124. Moreover, the sustaining part 124 of the locking member 12 has a perforation 1241. After the locking member 12 is combined with the heat sink 11, the fin 112a is penetrated through the perforation 1241 of the sustaining part 124.

In some embodiments, at least one second lateral plate 126 is downwardly extended from each of a third side 1213 and a fourth side 1214 of the rectangular frame 121 of the locking member 12. The third side 1213 and the fourth side 1214 are opposed to each other. In addition, a beveled structure 1261 is formed on the inner surface and the lower edge of each second lateral plate 126. In some embodiments, the bevel structure is exempted from the second lateral plate 126.

An example of the elastic element 13 includes but is not limited to a spring or a curvy resilient piece. Moreover, the elastic element 13 is preferably made of metallic material. In this embodiment, the fin 112a has a function of transferring heat and a function of positioning the elastic element 13. Consequently, the structure of the heat-dissipating module 1 is simplified. The locking member 12 may include one sustaining part, two sustaining parts, three sustaining parts or four sustaining parts. Correspondingly, the heat-dissipating module 1 comprises one elastic element, two elastic elements, three elastic elements or four elastic elements. In a case that the locking member 12 comprises two sustaining parts and the heat-dissipating module 1 comprises two elastic elements, these two sustaining parts are located at two opposite areas of a diagonal line of the rectangular frame 121 or two opposite sides of the rectangular frame 121. Whereas, in a case that the locking member 12 comprises four sustaining parts and the heat-dissipating module 1 comprises four elastic elements, these four sustaining parts are located at four corners of the rectangular frame 121 or the four sides of the rectangular frame 121. Whereas, in a case that the locking member 12 comprises one sustaining part and the heat-dissipating module 1 comprises one elastic element, the sustaining part is extended to and located at a center of the rectangular frame 121.

A process of assembling the heat-dissipating module 1 will be illustrated as follows. Firstly, the elastic elements 13 are sheathed around corresponding fins 112a of the heat sink 11. Then, the elastic elements 13 are sheathed around the fins 112a corresponding to the sustaining parts 124 of the rectangular frame 121. Then, the locking member 12 is combined with the heat sink 11. That is, the hooks 123 of the first lateral plates 122 of the rectangular frame 121 are engaged with the bottom surface and two opposite edges of the base 111 of the heat sink 11. Under this circumstance, the fins 112 of the heat sink 11 are penetrated through the hollow portion 125 of the locking member 12. In addition, the fins 112a sheathed by the elastic elements 13 are penetrated through corresponding perforations 1241 of the sustaining parts 124 of the rectangular frame 121. Moreover, the first part 131 of the elastic element 13 is sustained against the base 111 of the heat sink 11, and the second end 132 of the elastic element 13 is sustained against the sustaining parts 124 of the rectangular frame 121. The resulting structure of the assembled heat-dissipating module 1 is shown in FIG. 2.

Figure 3:
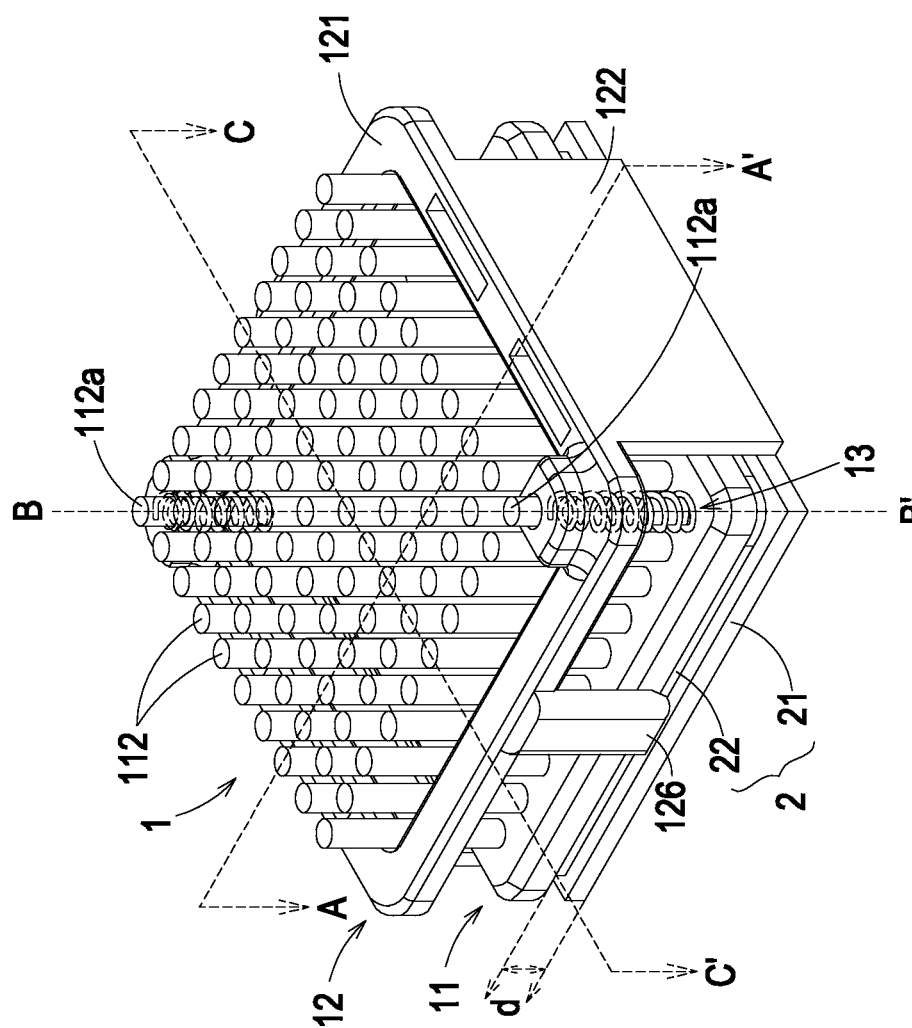
FIG. 3 is a schematic perspective view illustrating an assembled structure of a heat-dissipating module of FIG. 2 and an integrated circuit chipset according to an embodiment of the present invention.
Figure 4A:
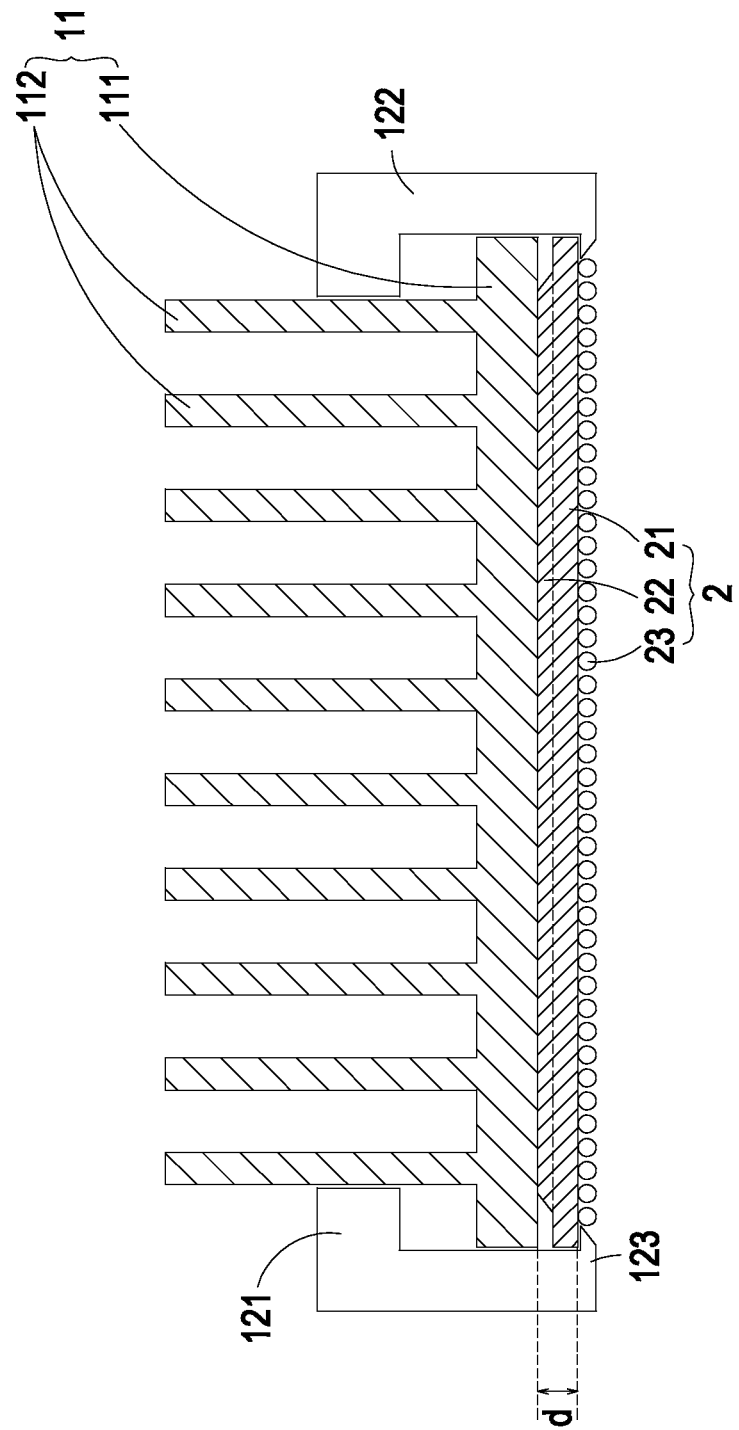
FIG. 4A is a schematic cross-sectional view illustrating the assembled structure of FIG. 3 and taken along the line AA'.
Figure 4B:
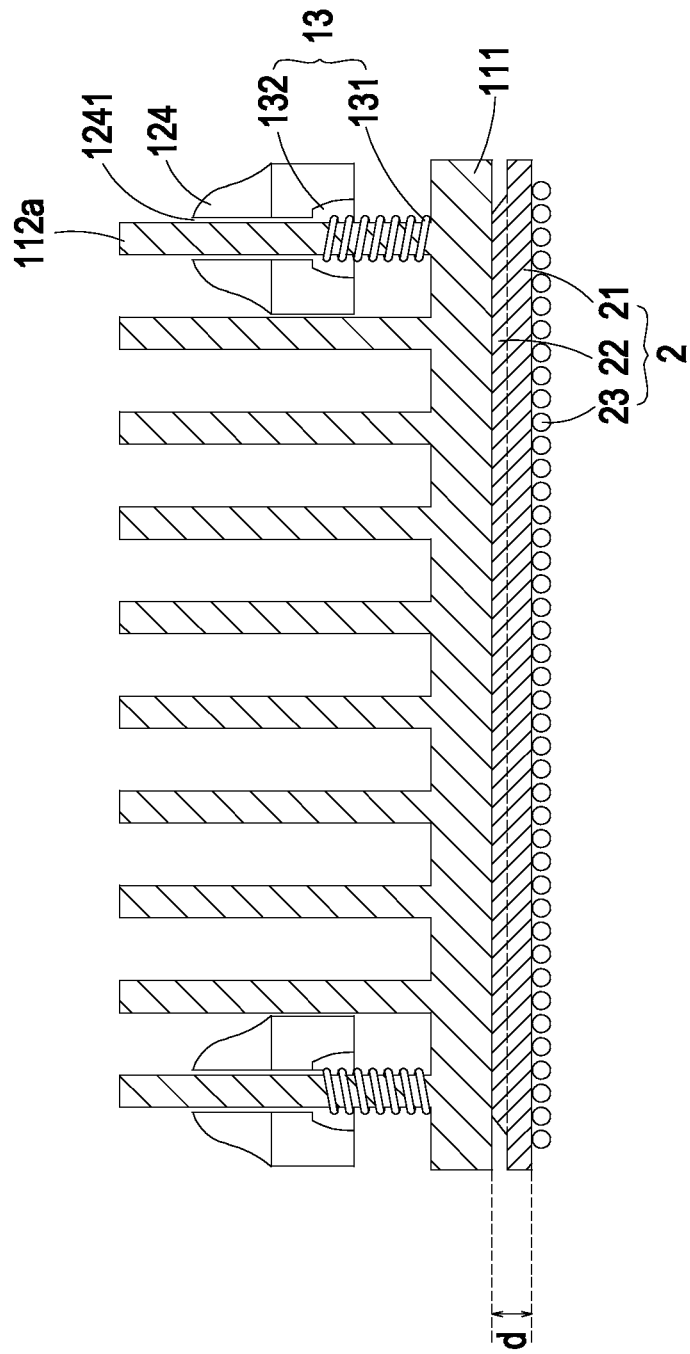
FIG. 4B is a schematic cross-sectional view illustrating the assembled structure of FIG. 3 and taken along the line BB'.
Figure 4C:
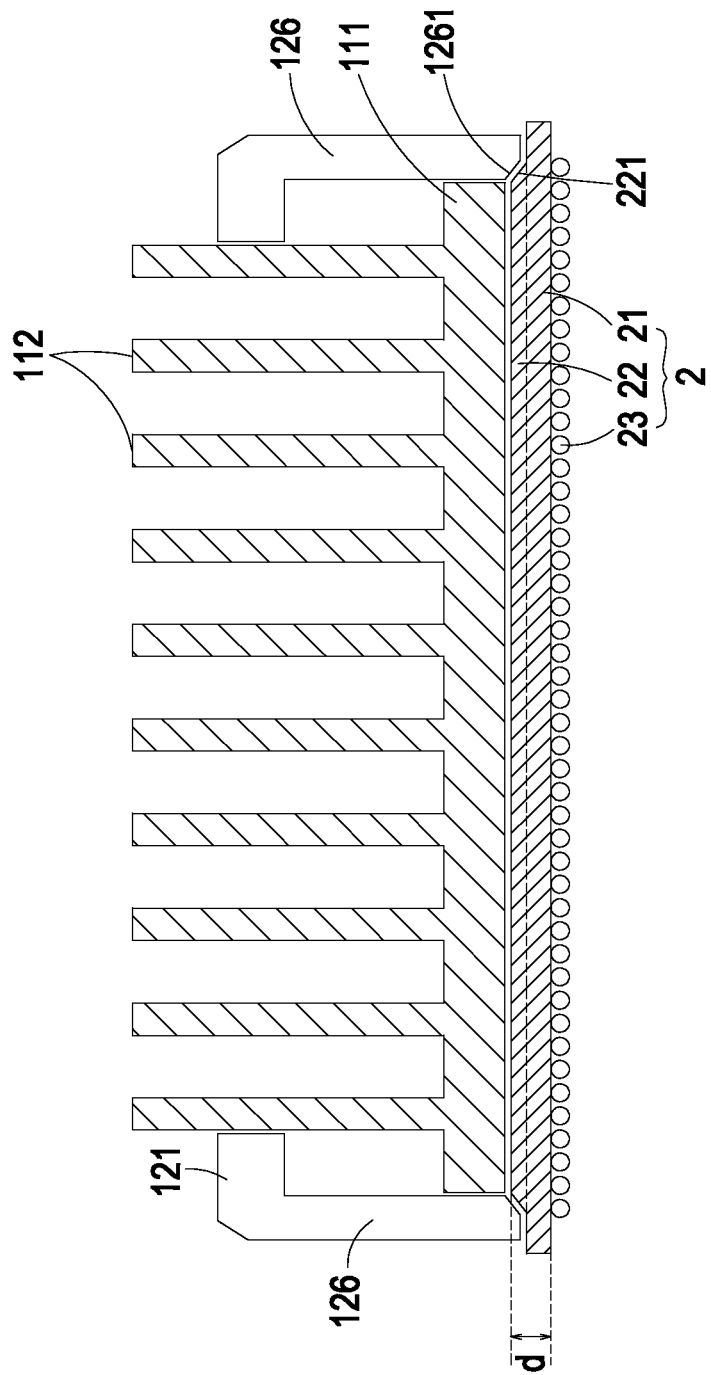
FIG. 4C is a schematic cross-sectional view illustrating the assembled structure of FIG. 3 and taken along the line CC'.

FIG. 3 is a schematic perspective view illustrating an assembled structure of a heat-dissipating module of FIG. 2 and an integrated circuit chipset according to an embodiment of the present invention. FIG. 4A is a schematic cross-sectional view illustrating the assembled structure of FIG. 3 and taken along the line AA'. FIG. 4B is a schematic cross-sectional view illustrating the assembled structure of FIG. 3 and taken along the line BB'. FIG. 4C is a schematic cross-sectional view illustrating the assembled structure of FIG. 3 and taken along the line CC'. Please refer to FIGS. 1, 2, 3, 4A, 4B and 4C. The assembled structure 3 is a combination of the heat-dissipating module 1 and an integrated circuit chipset 2. The thickness d of the integrated circuit chipset 2 may be varied according to the practical requirements. The integrated circuit chipset 2 is mounted on a system board (not shown). In this embodiment, the integrated circuit chipset 2 comprises a substrate 21, a chip 22 and a plurality of contact parts 23. An example of the integrated circuit chipset 2 includes but is not limited to a ball grid array (BGA) chipset. Correspondingly, the contact parts 23 are ball grid array (BGA) contact pads. Moreover, the periphery of the chip 22 has beveled edges 221 corresponding to the beveled structures 1261 of the second lateral plates 126 of the locking member 12. For combining the heat-dissipating module 1 with the integrated circuit chipset 2, the heat-dissipating module 1 is firstly aligned with the integrated circuit chipset 2. In response to a downward force exerted on the heat-dissipating module 1, the hooks 123 of the first lateral plates 122 of the locking member 12 are disengaged from the bottom surface of the base 111 of the heat sink 11 and moved downwardly to the positions below the integrated circuit chipset 2. After the downward force is released, the hooks 123 are engaged with two opposite edges of the bottom surface of the substrate 21 of the integrated circuit chipset 2. Meanwhile, the heat-dissipating module 1 and the integrated circuit chipset 2 are combined together to define the assemble structure 3. Under this circumstance, the elastic element 13 is subject to elastic deformation to accommodate the thickness d of the integrated circuit chipset 2. That is, the distance between the hook 123 and the base 111 of the heat sink 11 is adjusted through the elastic elements 13 according to the thickness d of the integrated circuit chipset 2. After the heat-dissipating module 1 and the integrated circuit chipset 2 are combined together, the heat-dissipating module 1 is fixed on the integrated circuit chipset 2. That is, the base 111 of the heat sink 11 is attached on the surface of the chip 22 of the integrated circuit chipset 2, so that the heat from the integrated circuit chipset 2 can be effectively transferred to the heat sink 11. Moreover, due to a proper contact pressure between the heat sink 11 of the heat-dissipating module 1 and the chip 22 of the integrated circuit chipset 2, the applicable range of the thickness d of the integrated circuit chipset 2 is widened.

Please refer to FIG. 4C again. The periphery of the chip 22 of the integrated circuit chipset 2 has beveled edges 221 corresponding to the beveled structures 1261 of the second lateral plates 126 of the locking member 12. Since the beveled structures 1261 are in contact with the beveled edges 221, the possibility of sliding the heat-dissipating module 1 relative to the integrated circuit chipset 2 will be minimized and the positioning purpose will be achieved.

Figure 5:
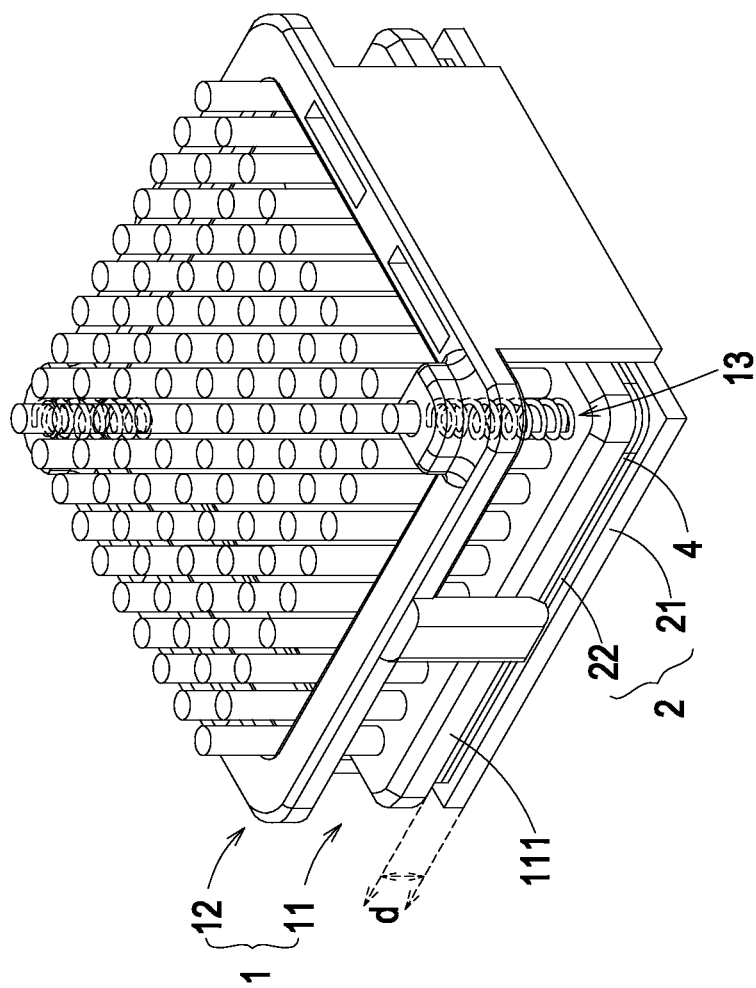
FIG. 5 is a schematic perspective view illustrating an assembled structure of a heat-dissipating module and an integrated circuit chipset according to another embodiment of the present invention.

FIG. 5 is a schematic perspective view illustrating an assembled structure of a heat-dissipating module and an integrated circuit chipset according to another embodiment of the present invention. In this embodiment, the assembled structure 3 further comprises a thermal pad 4. The thermal pad 4 is located between the base 111 of the heat sink 11 and the chip 22 of the integrated circuit chipset 2. By the thermal pad 4, the thermal contact between the heat sink 111 and the integrated circuit chipset 2 is increased. Consequently, the thermal conducting performance and the heat-dissipating efficacy are enhanced.

Figure 6C:
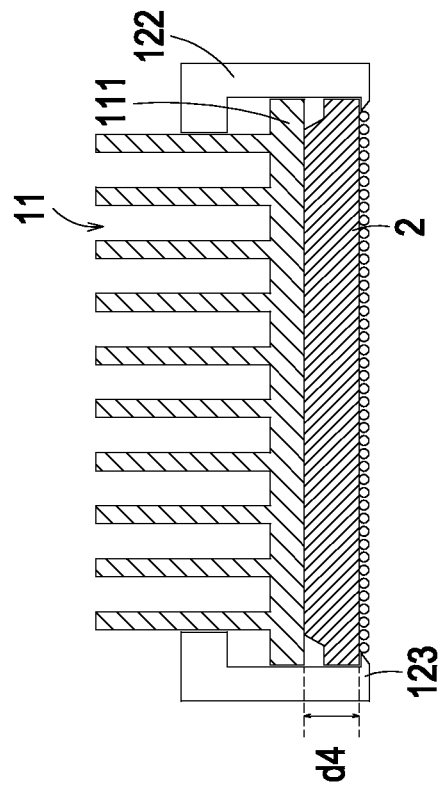
Figure 6D:
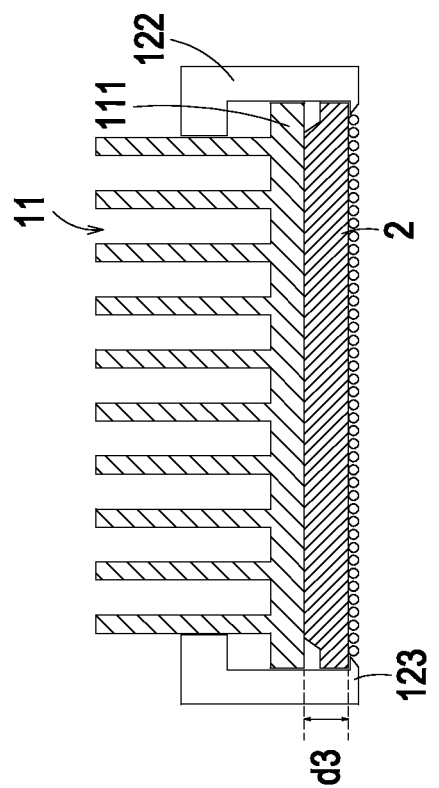

FIGS. 6A, 6B, 6C and 6D schematically illustrate four exemplary assembled structures, in which the thicknesses of the integrated circuit chipsets of the assembled structures are varied. As shown in FIGS. 6A-6D, the thickness of the integrated circuit chipset 2 is in the range between 1 mm and 5 mm. For example, the thickness d1 of the integrated circuit chipset 2 as shown in FIG. 6A is 1 mm; the thickness d2 of the integrated circuit chipset 2 as shown in FIG. 6B is 2 mm; the thickness d3 of the integrated circuit chipset 2 as shown in FIG. 6C is 3 mm; and the thickness d4 of the integrated circuit chipset 2 as shown in FIG. 6D is 5 mm. According to the thickness d of the integrated circuit chipset 2, the distance between the hook 123 and the base 111 of the heat sink 11 is adaptively adjusted through the elastic elements 13. As a consequence, the universal heat-dissipating module 1 can be applied to various integrated circuit chipsets 2 with different thicknesses.

From the above description, the present invention provides an assembled structure of a heat-dissipating module and an integrated circuit chipset. The heat-dissipating module comprises a heat sink, a locking member and at least one elastic element. The elastic element is sustained against the locking member and the heat sink. Consequently, the universal heat-dissipating module can be applied to various integrated circuit chipsets with different thicknesses. Since the heat-dissipating module is simple and easily assembled/disassembled, the short-circuited problem is avoided and the preparation cost and stock cost are both reduced. Moreover, since the locking member of the heat-dissipating module of the present invention has a narrower frame, the layout area of the heat sink can be effectively utilized and the heat-dissipating efficacy is enhanced. Moreover, since the elastic elements are engaged with corresponding fins of the heat sink, the layout space is saved and the configuration is simplified. Moreover, the heat-dissipating module is capable of adaptively adjusting the contact pressure between the heat-dissipating module and the integrated circuit chipset according to the thickness of the integrated circuit chipset, and fixed on the integrated circuit chipset. Consequently, the problems resulting from insufficient or too large contact pressure will be avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A heat-dissipating module, comprising:
a heat sink comprising a base and a plurality of fins;
a locking member comprising a rectangular frame with at least one sustaining part, wherein two first lateral plates are downwardly extended from a first side and a second side of said rectangular frame, respectively, wherein said first side and said second side are opposed to each other, and at least one hook is formed on an inner surface and a lower edge of each said first lateral plate; and
at least one elastic element having a first part sustained against said base of said heat sink and a second part sustained against said sustaining part of said rectangular frame,
wherein said sustaining part of said rectangular frame is aligned with a specified fin of said fins, and said elastic element is engaged with said specified fin.

2. The heat-dissipating module according to claim 1 wherein said rectangular frame has a hollow portion, and said fins of said heat sink are penetrated through said hollow portion.

3. The heat-dissipating module according to claim 1 wherein said elastic element is sheathed around said specified fin.

4. The heat-dissipating module according to claim 3 wherein said sustaining part has a perforation, wherein said specified fin sheathed by said elastic element is further penetrated through said perforation of said sustaining part.

5. The heat-dissipating module according to claim 1 wherein said locking member is made of plastic material.

6. The heat-dissipating module according to claim 1 wherein said elastic element is a spring, which is made of metallic material.

7. The heat-dissipating module according to claim 1 wherein at least one second lateral plate is downwardly extended from each of a third side and a fourth side of said rectangular frame, and said third side and said fourth side are opposed to each other, and wherein a beveled structure is formed on an inner surface and a lower edge of each said second lateral plate.

8. The heat-dissipating module according to claim 1 wherein said rectangular frame has a plurality of sustaining parts, which are located at corresponding corners of said rectangular frame.

9. The heat-dissipating module according to claim 1 wherein said heat-dissipating module is further attached on an integrated circuit chipset, which comprises a substrate and a chip, wherein said hooks of said first lateral plates of said locking member are engaged with two opposite edges of a bottom surface of said substrate of said integrated circuit chipset.

10. The heat-dissipating module according to claim 9 wherein according to a thickness of said integrated circuit chipset, a distance between said base of said heat sink and said hook of said locking member is correspondingly adjusted through said elastic element.

11. An assembled structure, comprising:
an integrated circuit chipset comprising a substrate and a chip; and
a heat-dissipating module combined with said integrated circuit chipset, and comprising:
a heat sink comprising a base and a plurality of fins;
a locking member comprising a rectangular frame with at least one sustaining part, wherein two first lateral plates are downwardly extended from a first side and a second side of said rectangular frame, respectively, wherein said first side and said second side are opposed to each other, and at least one hook is formed on an inner surface and a lower edge of each said first lateral plate; and
at least one elastic element having a first part sustained against said base of said heat sink and a second part sustained against said sustaining part of said rectangular frame,
wherein said sustaining part of said rectangular frame is aligned with a specified fin of said fins, and said elastic element is engaged with said specified fin; and
wherein said hooks of said first lateral plates of said locking member are engaged with two opposite edges of a bottom surface of said substrate of said integrated circuit chipset.

12. The assembled structure according to claim 11 wherein according to a thickness of said integrated circuit chipset, a distance between said base of said heat sink and said hook of said locking member is correspondingly adjusted through said elastic element.

13. The assembled structure according to claim 11 further comprising a thermal pad, which is arranged between said base of said heat sink and said chip of said integrated circuit chipset.

14. The assembled structure according to claim 11 wherein at least one second lateral plate is downwardly extended from each of a third side and a fourth side of said rectangular frame, and said third side and said fourth side are opposed to each other, and wherein a beveled structure is formed on an inner surface and a lower edge of each second lateral plate.

15. The assembled structure according to claim 14 wherein a periphery of the chip of said integrated circuit chipset has a beveled edge corresponding to said beveled structure of said second lateral plate, wherein said beveled structure is in contact with said beveled edges.

16. The assembled structure according to claim 11 wherein said elastic element is sheathed around said specified fin.

17. The assembled structure according to claim 16 wherein said sustaining part has a perforation, wherein said specified fin sheathed by said elastic element is further penetrated through said perforation of said sustaining part.

* * * * *